(12) United States Patent
Haukka et al.

(10) Patent No.: US 6,660,660 B2
(45) Date of Patent: Dec. 9, 2003

(54) METHODS FOR MAKING A DIELECTRIC STACK IN AN INTEGRATED CIRCUIT

(75) Inventors: Suvi P. Haukka, Helsinki (FI); Marko Tuominen, Espoo (FI)

(73) Assignee: ASM International, NV. (NL)

( * ) Notice: Subject to any disclaimer, the term of this patent is extended or adjusted under 35 U.S.C. 154(b) by 0 days.

(21) Appl. No.: 09/945,463

(22) Filed: Aug. 31, 2001

(65) Prior Publication Data

US 2002/0115252 A1 Aug. 22, 2002

Related U.S. Application Data

(60) Provisional application No. 60/239,040, filed on Oct. 10, 2000, provisional application No. 60/244,789, filed on Oct. 31, 2000, and provisional application No. 60/247,115, filed on Nov. 10, 2000.

(51) Int. Cl.[7] .................... H01L 21/31; H01L 21/469

(52) U.S. Cl. ............................................ 438/778

(58) Field of Search .................. 438/600, 593–594, 438/622, 642, 778

(56) References Cited

U.S. PATENT DOCUMENTS

| 5,316,793 | A | * | 5/1994 | Wallace et al. .......... 427/248.1 |
| 5,719,417 | A | | 2/1998 | Roeder et al. |
| 5,763,922 | A | * | 6/1998 | Chau .......................... 257/371 |
| 6,124,158 | A | | 9/2000 | Dautartas et al. ........... 438/216 |
| 6,124,620 | A | * | 9/2000 | Gardner et al. ............. 257/411 |
| 6,144,060 | A | | 11/2000 | Park et al. .................. 257/310 |
| 6,335,240 | B1 | | 1/2002 | Kim et al. |
| 2001/0006735 | A1 | | 7/2001 | Kim et al. |

FOREIGN PATENT DOCUMENTS

| EP | 10308283 | 11/1998 |
| EP | 11233726 | 8/1999 |
| JP | 58-033841 | 2/1983 |
| WO | WO 00/42667 | 7/2000 |
| WO | WO 00/55895 | 9/2000 |

OTHER PUBLICATIONS

Kim et al. EPAB Pub. No. DE019853598A1 "Manufacture of thin film by atomic layer deposition" Feb. 10, 2000.*

Peter Singer "Atomic Layer Deposition Targets Thin Films" Semiconductor International Sep. 1, 1999.*

Haukka, S. et al: "Growth mechanism of mixed oxides on alumina", Applied Surface Science, Mar. 1997, vol. 112, pp. 23–29.

Kattelus, H. et al., "Electrical Properties of Tantalum Based Composite Oxide Films," *Mat. Res. Soc. Symp. Proc.*, vol. 284, pp. 511–516 (1993).

Kattelus, H. et al., "Layered tantalum–aluminum oxide films deposited by atomic layer epitaxy," *Thin Solid Films*, vol. 225, pp. 296–298 (1993).

(List continued on next page.)

*Primary Examiner*—Craig Thompson
(74) *Attorney, Agent, or Firm*—Knobbe, Martens, Olson & Bear LLP (57) ABSTRACT

An ultrathin aluminum oxide and lanthanide layers, particularly formed by an atomic layer deposition (ALD) type process, serve as interface layers between two or more materials. The interface layers can prevent oxidation of a substrate and can prevent diffusion of molecules between the materials. In the illustrated embodiments, a high-k dielectric material is sandwiched between two layers of aluminum oxide or lanthanide oxide in the formation of a transistor gate dielectric or a memory cell dielectric. Aluminum oxides can serve as a nucleation layer with less than a full monolayer of aluminum oxide. One monolayer or greater can also serve as a diffusion barrier, protecting the substrate from oxidation and the high-k dielectric from impurity diffusion. Nanolaminates can be formed with multiple alternating interface layers and high-k layers, where intermediate interface layers can break up the crystal structure of the high-k materials and lower leakage levels.

5 Claims, 4 Drawing Sheets

OTHER PUBLICATIONS

Kim. Y. K. et al., "Novel capicitor technology for high density stand–alone and embedded DRAMs," *IEEE International Electron Devices Meeting*, IEDM (2000).

Kukli, K. et al., Properties of $(Nb_{1-x}Ta_x)_2O_5$ Solid Solutions and $(Nb_{1-x}Ta_x)_2O_5$–$ZrO_2$ Nanolaminates Grown by Atomic Layer Epitaxy, *NanoStructured Materials*, vol. 8, No. 7, pp. 785–793 (1997).

Kukli, K. et al., "Properties of $Ta_2O_5$–Based Dielectric Nanolaminates Deposited by Atomic Layer Epitaxy," *J. Electrochem. Soc.*, vol. 144, No. 1, pp. 300–306 (1997).

Kukli, K., "Properties of atomic layer deposited $(Ta_{1-x}Nb_x)_2O_5$ solid solution films and $Ta_2O_5$ nanolaminates," *Journal of Applied Physics*, vol. 86, No. 10 (1999).

Lakomaa, E–L. et al., "Surface reactions in $Al_2O_3$ growth from trimethylaiuminum and water by atomic layer epitaxy," *Applied Surface Science*, vol. 107, pp. 107–115 (1996).

Ritala, M. et al., "Surface roughness reduction in atomic layer epitaxy growth of titanium dioxide thin films," *Thin Solid Films*, vol. 249, pp. 155–162 (1994).

Zhang, H. et al., "High permittivity thin film nanolaminates," *Journal of Applied Physics*, vol. 87, No. 4, pp. 1921–1924 (2000).

* cited by examiner

METHODS FOR MAKING A DIELECTRIC STACK IN AN INTEGRATED CIRCUIT

REFERENCE TO RELATED APPLICATIONS

The present application claims the priority benefit under 35 U.S.C. §119(e) to prior provisional application No. 60/239,040, filed Oct. 10, 2000, entitled METHOD OF DEPOSITING OXIDE THIN FILMS, provisional application No. 60/244,789, filed Oct. 31, 2000, entitled ALUMINUM OXIDE INTERFACE FILMS AND METHODS THEREFOR, and provisional application No. 60/247,115, filed Nov. 10, 2000, entitled DIELECTRIC INTERFACE FILMS AND METHODS THEREFOR.

FIELD OF THE INVENTION

The present invention relates generally to thin dielectric films in integrated circuits, and more particularly to interface layers for dielectric thin films.

BACKGROUND AND SUMMARY OF THE INVENTION

Atomic Layer Deposition (ALD) is a self-limiting process, whereby alternated pulses of reaction precursors saturate a substrate and leave no more than one monolayer of material per pulse. The precursors and deposition conditions are selected to ensure self-saturating reactions. For example, an adsorbed layer in one pulse leaves a surface termination that is non-reactive with the gas phase reactants of the same pulse. A subsequent pulse of different reactants do react with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601–663, Elsevier Science B.V. 1994.

Recently, these processes have been suggested for use in semiconductor fabrication. However, due to the slowness of the process (depositing one atomic layer of material per cycle), ALD has been of little practical benefit for current commercial process flows.

One material for which ALD processes have been developed is aluminum oxide ($Al_2O_3$). The deposition of aluminum oxide by ALD type processes is well known in the art. See, e.g., E.-L. Lakomaa, A. Root, T. Suntola, "Surface reactions in $Al_2O_3$ growth from trimethylaluminium and water by atomic layer epitaxy", Appl. Surf. Sci. 107 (1996) 107–115. This article is incorporated herein by reference.

In accordance with one aspect of the invention, an oxide interface layer is provided for a dielectric structure positioned between two conductive materials in an integrated circuit. The preferred embodiments employ metal oxide thin films for the interface layer, particularly aluminum oxide and lanthanide ("rare earth") oxides, which can advantageously remain amorphous even after exposure to high temperatures. The oxide interface layer is preferably deposited by an atomic layer deposition (ALD) type process. Advantageously, the preferred interface materials do not readily react with many other materials and are very good barriers against the diffusion of molecules, atoms and ions. $Al_2O_3$ and lanthanide oxides can be deposited by ALD processes with excellent control; extremely thin, uniformly thick layers can be formed without pinholes and at a wide range of substrate temperatures, depending on the source chemicals. Thus, ALD enables oxide layers thin enough to serve as an interface layer without adversely affecting electrical properties of the integrated circuit.

In accordance with another aspect of the invention, a high dielectric constant (high-k) dielectric structure is provided in an integrated circuit. The high-k dielectric structure comprises a first interfacial layer of aluminum oxide, a layer of high-k material directly adjacent the first interfacial layer, and a second interfacial layer of aluminum oxide directly adjacent the high-k material. The high-k material preferably has a dielectric constant of at least about 5, and more preferably at least about 10. Exemplary high-k materials include, but are not limited to, zirconium oxide ($ZrO_2$), hafnium oxide ($HfO_2$), titanium oxide ($TiO_2$), tantalum oxide ($Ta_2O_5$), barium strontium titanate (BST), strontium titanate (ST), barium titanate (BT), lead zirconium titanate (PZT), lead strontium titanate (PST), strontium bismuth tantalate (SBT), metal silicates, aluminum nitride and nitrided metal oxides (e.g., $Ta_xO_yNb_z$, $Nb_xO_yN_z$). The aluminum oxide interfacial layers can also be replaced by lanthanide oxide layers.

The dielectric structure is positioned between a first conductor and a second conductor. Aluminum oxide and lanthanide oxides have been found particularly beneficial as interface layers between doped semiconductor structures, such as a doped silicon substrate in a transistor structure, and other dielectric materials. Furthermore, their excellent interfacial properties facilitate advanced materials. For example, aluminum oxide has been found particularly advantageous between high-k materials and poly-SiGe gate electrodes. During CVD of SiGe, nucleation over ALD $Al_2O_3$ during initial phases of deposition was found superior to that over $SiO_2$, thus speeding overall deposition rates. Other gate electrode materials may also be made possible due to superior nucleation of depositions thereover and protection against corrosion and impurity diffusion offered by the aluminum oxide interface between the gate electrode and the high-k material. In another example, a high-k dielectric structure (including a high-k material sandwiched between aluminum or lanthanide oxide interfacial layers) serves as a capacitor dielectric in an integrated circuit. The interfacial layers are of particular utility over silicon electrodes, such as hemispherical grained silicon (HSG-Si), but are also useful barriers for protection of other oxidation-susceptible electrode materials.

Another aspect of the present invention is an aluminum oxide layer or a lanthanide oxide layer located between two materials, where the oxide layer has a thickness between one full molecular monolayer and about 4 molecular monolayers. The oxide layer prevents diffusion of molecules from one material to the other.

Another aspect of the invention provides a method of preventing the oxidation of a substrate by depositing a layer of aluminum oxide or lanthanide oxide on the substrate by an ALD type process. Substrates otherwise susceptible to oxidation include conventional semiconductor substrates, such as single-crystal silicon wafers or epitaxial layers.

BRIEF DESCRIPTION OF THE DRAWINGS

These and other aspects of the invention will be readily understood in view of the description below and the appended drawings, which are meant to illustrate and not to limit the invention, and in which.

DETAILED DESCRIPTION OF THE PREFERRED EMBODIMENT

While illustrated in the context of transistor gate stacks, the skilled artisan will readily find application for the principles and advantages disclosed herein to other situations where similar electrical and physical properties at an interface are desired.

The present invention utilizes a thin dielectric film as an interface layer between two materials to prevent a detrimental reaction between them. A detrimental reaction may include a chemical reaction or diffusion. For example, $Al_2O_3$ can be placed as a lower interface layer under any high-k material, or as a top interface layer that is compatible with polysilicon or SiGe (alloy of silicon and germanium). The primary example herein of such a dielectric interface film is $Al_2O_3$; however, as discussed below, lanthanide oxides have also been found to have excellent interfacial properties in a dielectric stack.

$Al_2O_3$ or lanthanide oxide thin films may be used to prevent a solid phase from reacting with the surroundings. For example, the solid phase can be deposited directly over an $Al_2O_3$ thin film. Alternatively an $Al_2O_3$ or lanthanide oxide layer can be deposited directly over the solid phase. In a third variation, the solid phase can be sandwiched between two $Al_2O_3$ or lanthanide oxide thin films.

More particularly, $Al_2O_3$ can act as a diffusion barrier interface and prevent the diffusion of molecules, atoms or ions from a solid phase on one side of the $Al_2O_3$ layer to a solid phase on the other side of the $Al_2O_3$ layer. For example, $Al_2O_3$ may serve as a boron diffusion barrier. For a diffusion barrier function of an interface layer, at least one molecular monolayer of $Al_2O_3$ is desired, preferably between about 1 and 4 monolayers, and more preferably between about 1 and 2 monolayers. In terms of absolute thickness, the aluminum oxide interfacial layer preferably has a thickness between about 3 Å and 15 Å, more preferably between about 3 Å and 9 Å.

An $Al_2O_3$ surface can also act as a nucleation layer at a top interface for further solid phase growth. In the context of integrated circuit formation, a high dielectric material can be deposited on a lower aluminum oxide interface layer. An in situ doped silicon layer (such as boron-, arsenic-phosphorus- or germanium-doped silicon) can also be directly deposited directly over a top aluminum oxide interface layer on an $Al_2O_3$ thin film in the production of a gate dielectric. The nucleation layer speeds initial deposition of silicon-containing layers, particularly in situ doped silicon, which can have long nucleation times over $SiO_2$, as is known in the art. Accordingly, throughput can be radically improved. To serve as a nucleation layer, as little as one cycle of an ALD $Al_2O_3$ process (representing less than one monolayer, typically about ⅓ of a monolayer) can improve nucleation times of deposition thereover, especially for the top aluminum oxide interface layer between a high-k material and a gate electrode. Such a partial monolayer will typically manifest as aluminum oxide "dots" evenly spread over the substrate. These separated dots are sufficient to provide rapid and uniform nucleation across the substrate. However, it is preferred for most integrated circuit contexts to produce an aluminum oxide layer thick enough to also serve as a barrier layer, as discussed in the previous paragraph.

The invention is particularly useful, therefore, in forming upper and/or lower interfaces on a high-k dielectric constant material, such as $ZrO_2$. For example, an $Al_2O_3/ZrO_2/Al_2O_3$ sandwich structure has excellent physical and electrical properties in a gate dielectric. Lower equivalent oxide thickness (EOT) is obtained when $Al_2O_3$ is used instead of $SiO_2$ as an interface layer, since the dielectric constant of $Al_2O_3$ (on the order of 10) is higher than that of $SiO_2$. Other high-k materials include hafnium oxide ($HfO_2$), titanium dioxide ($TiO_2$), tantalum oxide ($Ta_2O_5$), barium strontium titanate (BST), strontium titanate (ST), barium titanate (BT), lead zirconium titanate (PZT) and strontium bismuth tantalate (SBT). These materials and other, similar materials, while advantageously demonstrating high dielectric constants, tend to be unstable and/or inconsistent in composition, and also tend to require highly oxidizing environments during deposition. Thus, to prevent oxidation of the underlying substrate, a lower aluminum oxide interface layer is preferably in the range of about 1–4 monolayers in thickness (representing about 3–15 ALD cycles with TMA and water), more preferably between about 1 monolayer and 2 monolayers. In addition to minimizing impurity and oxygen diffusion, an $Al_2O_3$ layer can prevent the agglomeration of a high-k material during the high-k deposition.

The skilled artisan will appreciate that similar aluminum oxide sandwiches will have application to memory cell capacitors.

For the purpose of the present invention, an "ALD type process" designates a process in which deposition of vaporized material onto a surface is based on sequential and alternating self-saturating surface reactions. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601–663, Elsevier Science B.V. 1994, the disclosure of which is incorporated herein by reference.

"Reaction space" designates a reactor or reaction chamber in which the conditions can be adjusted so that deposition by ALD is possible.

The present invention provides an oxide interface between two or more materials. Preferably, one of the materials is a high dielectric material, such as $ZrO_2$. The high dielectric material preferably has a dielectric constant greater than 5. More preferably the high dielectric material has a dielectric constant greater than about 10. Such "high-k" materials include oxides of Group 4 and Group 5 metals (e.g., Ti, Zr, Hf, V, Nb, Ta), as well as more complex oxides. As noted below, "high-k" materials can also include lanthanide oxides, such as lanthanum oxide (k≈21), neodymium oxide (k≈16) and cerium dioxide (k≈15).

In one aspect, the present invention provides an aluminum oxide sandwich, wherein two aluminum oxide layers are used as interface layers separating three other materials. The structure of such an aluminum oxide sandwich can be represented by material 1/$Al_2O_3$/material 2/$Al_2O_3$/material 3. Preferably, materials 1 and 3 are conductors in an integrated circuit, while material 2 is a thin dielectric film. "Thin," in this context, refers to a dielectric layer thin enough to serve as a capacitor dielectric (in combination with the $Al_2O_3$ interface layers) when charge is stored on one of the conductive materials 1 and 3. Such capacitor dielectric functions are most typically found in gate dielectrics and memory cell dielectrics.

Figure 1:
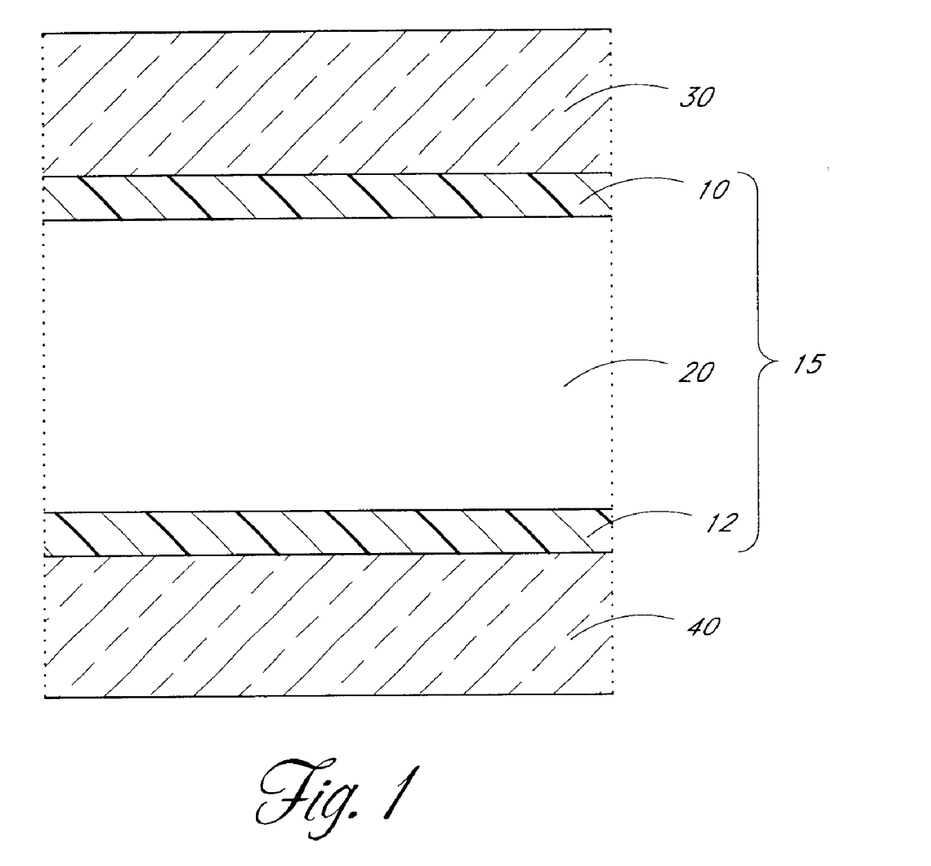
FIG. 1 is a schematic view of an integrated circuit transistor, including aluminum oxide or lanthanide oxide interfacial layers, in accordance with the preferred embodiments.

In the embodiment of FIG. 1, an aluminum oxide or lanthanide oxide sandwich 15 is part of a transistor gate electrode. FIG. 1 depicts a cross section of such an arrangement. Aluminum oxide or lanthanide oxide layers 10, 12 directly contact either side of a dielectric material layer 20. The oxide layers 10, 12 serve as interfacial layers between the dielectric material 20 and the overlying gate electrode 30, and between the dielectric material and the underlying silicon substrate 40. Preferably, the gate electrode comprises polycrystalline silicon, and more preferably poly-SiGe. In the oxide sandwich 15, the middle dielectric layer is preferably characterized by a high dielectric constant (high-k), comprising $ZrO_2$ in the illustrated embodiment. In other arrangements, it will be understood that the high-k material can comprise multiple materials, either as a ternary structure or a laminate (see FIG. 4) of multiple high-k material layers. As noted above, where the oxide layers 10, 12 comprise aluminum oxide, they preferably each have a thickness between about 1 Å (⅓ monolayer) and 15 Å (4 monolayers), more preferably between about 3 Å and 9 Å, and most preferably between about 3 Å and 6 =Å.

Figure 3:
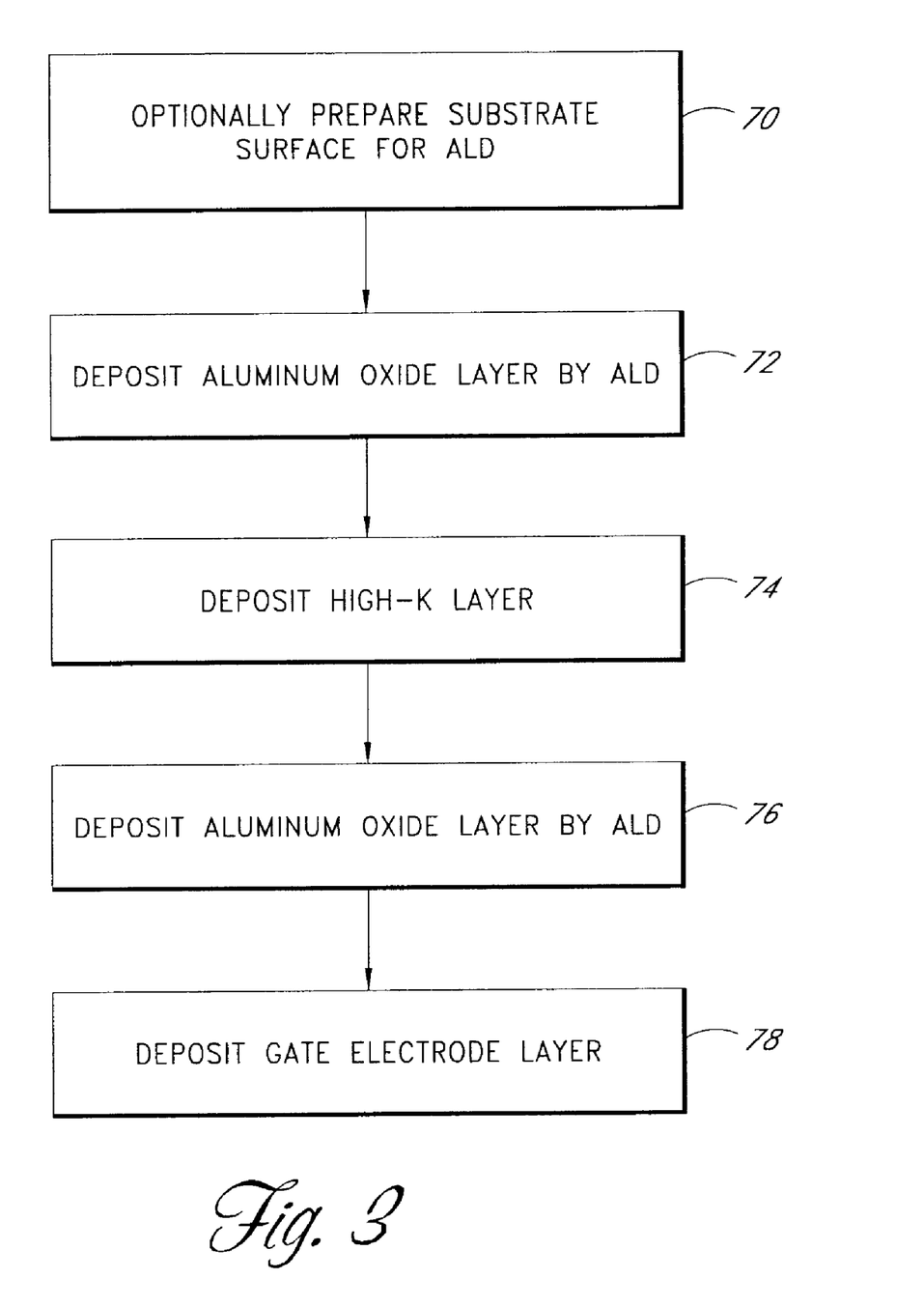
FIG. 3 is a flow chart illustrating a process of forming gate stacks, in accordance with a preferred embodiment of the invention.

FIG. 3 illustrates an exemplary sequence for forming interfacial layers in accordance with the preferred embodiments. The sequence shown is for forming a transistor gate dielectric structure between a semiconductor substrate and a gate electrode, including aluminum oxide interface layers sandwiching a high-k material. Initially, the semiconductor substrate surface can be optionally prepared 70 for subsequent deposition by ALD. Such preparation can include, for example, water or alcohol treatment, as described in more detail below. Subsequently, a first aluminum oxide interface layer is deposited 72 by ALD. A high-k layer is deposited 74 thereover. This layer can also be deposited in situ within the same reaction chamber. A second aluminum oxide interface layer is then deposited 76 by ALD over the high-k layer. A transistor gate electrode is then deposited 78 over the second interface layer. A cluster tool having in situ wafer cleaning, ALD and CVD modules can be employed, particularly where the interface layer is formed by ALD and the high-k material is formed by CVD or other method.

THE OXIDE INTERFACE FORMATION PROCESS

According to one preferred embodiment, alternating vapor-phase pulses of an aluminum or lanthanide source chemical and an oxygen source chemical are fed to a reaction chamber having a reduced pressure and contacted with a heated substrate surface to form an aluminum or lanthanide oxide thin film. The source chemical pulses are separated from each other by removal steps, preferably with flowing inert or noble gas, so that gas phase reactions are avoided and only self-saturating surface reactions are enabled. The general process will be better understood by reference to FIG. 2, exemplifying aluminum oxide deposition by ALD, discussed below.

THE SOURCE MATERIALS

1. Metal Source Materials

The aluminum or lanthanide source chemical is selected from a group of aluminum and lanthanide compounds that are volatile and thermally stable at the substrate temperature.

1.1 Alkyl Aluminum Compounds

Alkyl aluminum compounds have at least one aluminum-carbon bond. Examples of source compounds are trimethylaluminum $(CH_3)_3Al$, triethylaluminum $(CH_3CH_2)_3Al$, tri-n-butylaluminum $(n-C_4H_9)_3Al$, diisobutylaluminum hydride $(i-C_4H_9)_2AlH$, diethylaluminum ethoxide $(C_2H_5)_2AlOC_2H_5$, ethylaluminum dichloride $(C_2H_5)_2AlCl_2$, ethylaluminum sesquichloride $(C_2H_5)_3Al_2Cl_3$, diisobutylaluminum chloride $(i-C_4H_9)_2AlCl$ and diethylaluminum iodide $(C_2H_5)_2AlI$. These compounds are commercially available from, e.g., Albemarle Corporation, USA.

In the preferred embodiment, trimethylaluminum $(CH_3)_3Al$ is used as the aluminum source chemical.

1.2 Aluminum Alkoxides (Al—O—C Bond)

Aluminum alkoxides contain an aluminum-oxygen-carbon (Al—O—C) bond. Examples of source compounds are aluminum ethoxide $Al(OC_2H_5)_3$, aluminum isopropoxide $Al[OCH(CH_3)_2]_3$ and aluminum s-butoxide $Al(OC_4H_9)_3$. These compounds are commercially available from, e.g., Strem Chemicals, Inc., USA.

1.3 Aluminum Beta-diketonates

Aluminum beta-diketonates have organic ligands coordinated to aluminum via oxygen atoms. Examples of source compounds are aluminum acetylacetonate $Al(CH_3COCHCOCH_3)_3$, often shortened as $Al(acac)_3$, and tris-(2,2,6,6-tetramethyl-3,5-heptanedionato)aluminum, usually shortened as $Al(thd)_3$, $Al(TMHD)_3$ or $Al(DPM)_3$. Volatile halogenated aluminum beta-diketonates are also commercially available, such as aluminum hexafluoroacetylacetonate $Al(CF_3COCHCOCF_3)_3$, often shortened as $Al(hfac)_3$. These compounds are commercially available from, e.g., Strem Chemicals, Inc., USA.

1.4 Aluminum Halides

Volatile, purely inorganic aluminum halides such as aluminum chloride $AlCl_3$ or $Al_2Cl_6$, aluminum bromide $AlBr_3$, and aluminum iodide $AlI_3$ may be used as precursors

1.5 Anhydrous Aluminum Nitrate

At low substrate temperatures, anhydrous aluminum nitrate can be used as an aluminum source chemical for ALD. The synthesis of anhydrous $Al(NO_3)_3$ has been described by G. N. Shirokova, S. Ya. Zhuk and V. Ya. Rosolovskii in *Russian Journal of Inorganic Chemistry*, vol. 21, 1976, pp. 799–802, the disclosure of which is incorporated herein by reference. The aluminum nitrate molecule breaks into aluminum oxide when it is contacted with organic compounds, such as ethers.

1.5 Anhydrous Aluminum Nitrate

Lanthanides can be made volatile with selected ligands that prevent interaction between lanthanide atoms in the precursor or source. Examples of suitable ligands include beta-diketonates, such as thd (thd=2,2,6,6-tetramethyl-3,5-heptanedione) and alkyldisilazanes, such as hmds (hmds=N$(Si(CH_3)_3)_2$). Physically stable lanthanides from which to form these precursors include scandium (Sc), yttrium (Y), lanthanum (La), cerium Ce, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

2. Oxygen Source Materials

Volatile or gaseous compounds that contain oxygen and are capable of reacting with an aluminum source compound on the substrate surface resulting in the deposition of aluminum oxide are used as oxygen source materials. The choice of oxygen source material may be influenced by the substrate on which the aluminum oxide layer is to be deposited and thus whether the aluminum oxide thin film will form a top interface layer or a bottom interface layer.

In the production of an aluminum oxide sandwich on a silicon substrate, hydrogen peroxide, ozone and oxygen with unpaired electrons are preferably used only for the top interface. Water and alcohols, such as methanol, ethanol and isopropanol, may be used for any interface, as they are less liable to oxidize the underlying silicon during the deposition process. Alcohols are especially reactive with aluminum halides.

THE CHEMISTRY

ALD of Aluminum Oxide

Figure 2:
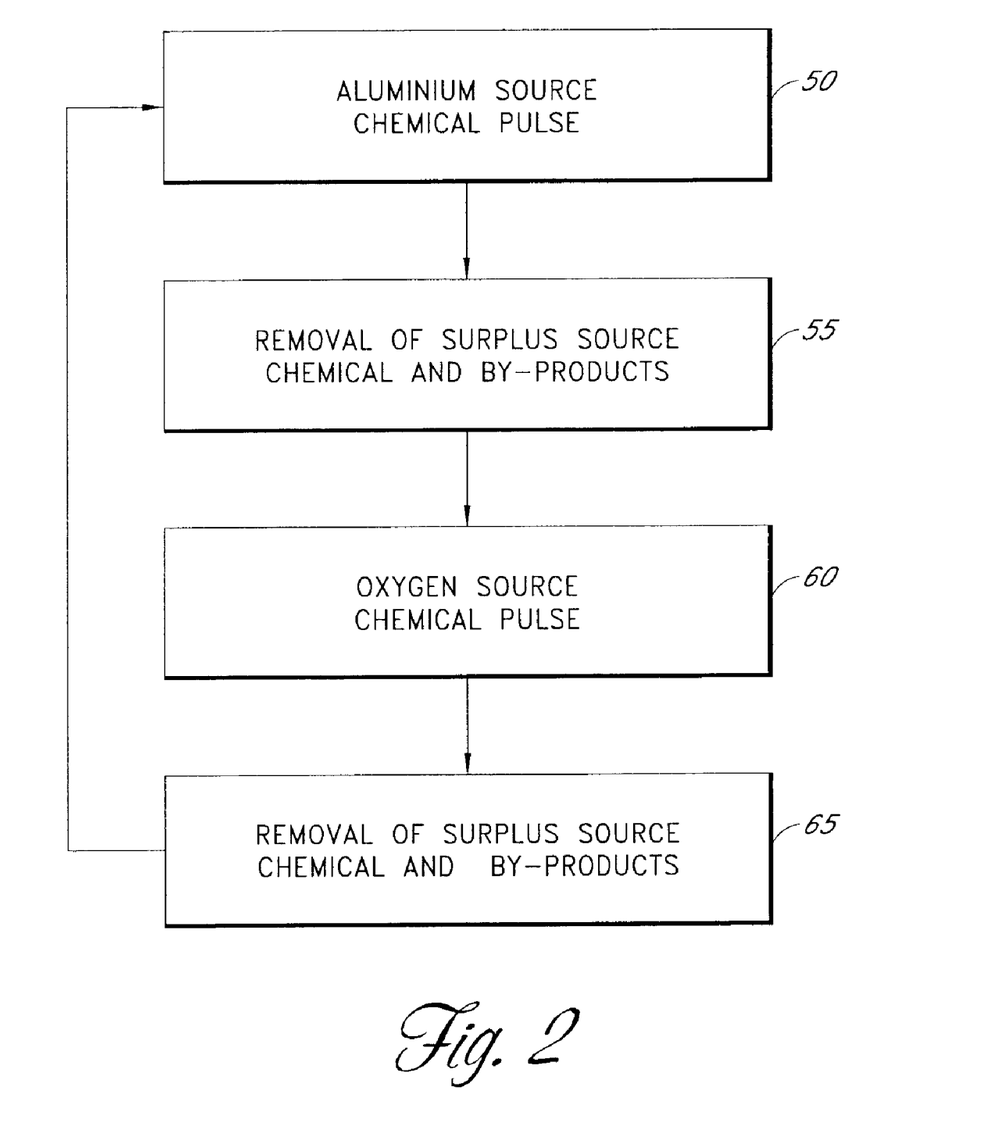
FIG. 2 is a flow chart of a preferred method of depositing aluminum oxide using an ALD process.

A substrate is loaded into a reaction space. The reaction space is adjusted to the desired temperature and the gas atmosphere of the reaction space is adjusted to the desired pressure. A repeatable process sequence including four basic steps, as depicted in FIG. 2, is begun. Aluminum oxide deposition is shown, though the skilled artisan will appreciate, in view of the present disclosure, that a similar process can be used to deposit lanthanide oxides.

With reference to FIG. 2, a vapor phase pulse 50 of an aluminum source chemical is introduced into the reaction space and contacted with the substrate surface. After a first contact time the surplus aluminum source chemical and any possible reaction byproducts are removed 55 from the reaction space by varying the reaction space pressure and/or by inert gas flow. After a first purging time a vapor phase pulse 60 of an oxygen source is introduced into the reaction chamber and contacted with the substrate surface. After a second contact time the surplus oxygen source chemical and any possible reaction byproducts are removed 65 from the reaction space by varying the reaction space pressure and/or by inert gas flow. After a second purging time the illustrated process cycle is repeated until an aluminum oxide thin film of a desired thickness is obtained. Finally, the substrate having the thin film is unloaded from the reaction chamber or another thin film process is started.

It will be appreciated that a similar sequence to that of FIG. 2, with the aluminum source chemical replace by a lanthanide source chemical pulse, will result in deposition of a lanthanide oxide layer.

SURFACE PREPARATION PRIOR TO ALD

As illustrated in FIG. 3, substrate surfaces may benefit from a surface pretreatment 70 prior to ALD thereover. A few exemplary surface preparation treatments are provided below, depending upon the starting surface.

Silicon Substrate with Surface Native Oxide

Substrates with native oxide will typically not require surface preparation. Rather, the above-described ALD process (e.g., with the TMA/purge/water/purge cycle of Example 1 below) will initially react with the native oxide and deposition will proceed as discussed above.

Silicon Substrate with an Etched Silicon Surface

It is unlikely that aluminum alkyls, such as $(CH_3)_3Al$, can attach on a hydrogen-terminated silicon surface. However, a first water pulse may react with the silicon surface and leave a hydroxyl terminated (—OH) or oxygen bridged (Si—O—Si) silicon surface that serves as a starting surface for the chemisorption of aluminum alkyls. The process described above and illustrated in FIG. 2 can proceed thereafter, as the preferred precursors readily react with $SiO_2$ to deposit $Al_2O_3$ thereover.

Ozone Treatment of Silicon Surface

Ozone reacts with silicon and thus forms a silicon dioxide layer or increases the thickness of the native silicon dioxide layer, depending of course upon temperature, exposure duration and $O_3$ concentration. Either a native oxide or H-terminated silicon surface can be thus prepared for the formation of an aluminum oxide thin film with an initial ozone pulse.

REPLACEMENT REACTION

According to one embodiment, a silicon dioxide surface (preferably a very thin native oxide) can be treated with an aluminum source chemical to produce an exchange reaction with the surface, replacing $SiO_2$ with $Al_2O_3$. For example:

$$1.5SiO_2(s)+2AlL_3(g) \rightarrow Al_2O_3(s)+1.5SiL_4(g) \; \Delta G_f(\text{temp.}/°\text{C.})=<0\,[kJ]$$

L is a ligand, preferably a halide such as chloride, bromide or iodide, more preferably comprising chloride, as set forth in Example 3 below.

The Gibb's free energies can be calculated, e.g., with HSC Chemistry, Ver. 4.1, Outokumpu Research Oy, Pori, Finland.

The exchange reaction is preferably applied to relatively thin layers. The aluminum oxide layer formed by the exchange reaction is used as an interface layer between silicon and a high-k material

LANTHANIDE OXIDES

Amorphous aluminum and lanthanide oxides deposited by ALD are utilized in dielectric thin films. These oxides are combined with high-k materials to produce state-of-the-art gate dielectrics and integrated circuit capacitor dielectrics, particularly for integrated memory cells. Exemplary transistors include silicon or SiGe gate electrodes, and monocrystalline silicon or GaAs substrates. Exemplary memory devices include dynamic random access memory (DRAM), synchronous DRAM (SDRAM), direct Rambus™ DRAM (DRDRAM), static random access memory (SRAM), and non-volatile memory devices. Non-volatile memory devices include read only memory (ROM), programmable ROM (PROM), erasable programmable ROM (EPROM), electrically erasable programmable ROM (EEPROM) and flash memory devices.

The lanthanide elements, such as lanthanum (La), yttrium (Y) and scandium (Sc), have also been known as rare earth elements. The use of the word "rare" in this term is misleading because these elements are not particularly rare on Earth. As stated by N. N. Greenwood and A. Earnshaw in CHEMISTRY OF THE ELEMENTS, Pergamon Press Ltd. 1986, cerium (Ce) is 5 times as abundant as lead (Pb). Even thulium (Tm), the rarest of the stable rare earth elements, is more abundant than iodium (I). Lanthanides are usually extracted either from monazite or bastnaesite minerals. It can be seen that, from an economical point of view, the utilization of rare earths for thin film structures is quite feasible. As used herein, "physically stable lanthanides" are defined as scandium (Sc), yttrium (Y), lanthanum (La), cerium Ce, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

Lanthanide compounds are similar to compounds of aluminum in certain aspects. Aluminum oxide $Al_2O_3$ has a very high melting point (2070° C.), while the melting point of yttrium oxide $Y_2O_3$ is 2410° C. and that of lanthanum oxide $La_2O_3$ 2307° C. All of these oxides are also quite inert and have high resistivities. Bonds between the metal and oxygen atoms are very strong. For example, Al—O has a bond strength of 512 kJ/mol, La—O has a bond strength of 799 kJ/mol and Y—O has a bond strength of 715 kJ/mol. CRC HANDBOOK OF CHEMISTRY AND PHYSICS, CRC Press, Inc. High melting points and bond strengths indicate that amorphous aluminum and lanthanide oxides can be heated to high temperatures without crystallization. Chemical inertness is beneficial for keeping nanolaminate layers (as described below) separated from each other and from surrounding materials and having a stable dielectric structure during the fabrication and lifetime of the manufactured devices.

NANOLAMINATE DIELECTRICS

Nanolaminate dielectric structures have been reported in the past. For example, Ritala et al. have made $Al_2O_3$—$TiO_2$ nanolaminates by ALD using $TiCl_4$, $AlCl_3$, $H_2O$ as source chemicals, where the $TiO_2$ layers were polycrystalline and the $Al_2O_3$ layers were amorphous. M. Ritala, M. Leskela, L. Niinisto, T. Prohaska, G. Friedbacher and M. Grassenbauer, "Surface roughness reduction in atomic layer epitaxy growth of titanium dioxide thin films," Thin Solid Films, Vol. 249 (1994), pp. 155–162. $Al_2O_3$ layers placed in the film reduced the surface roughness of the $TiO_2$ thin film. The article conducted depositions at 500° C. and concludes that alternating 925 cycles of $TiO_2$ deposition with 75 cycles of $Al_2O_3$ deposition minimized surface roughness, as measured by maximized optical transmission. $Ta_2O_5$—$Al_2O_3$ nanolaminates are also disclosed in H. Kattelus, M. Ylilammi, J. Saarilahti, J. Antson and S. Lindfors, "Layered Tantalum-Aluminum Oxide Films Deposited by Atomic Layer Epitaxy," Thin Solid Fihns, Vol. 225 (1993), pp. 296–298. $TaCl_5$, $AlCl_3$ and $H_2O$ were used as source chemicals. With depositions conducted at 300° C. and no post-deposition treatment, the authors conclude that even small amounts of aluminum oxide introduced as thin layers in the tantalum oxide results in improvement in the dielectric properties.

According to one embodiment of the present invention, a nanolaminate consists of alternating crystalline and amorphous layers of metal oxides. Amorphous layers decrease the leakage current through the nanolaminate while crystalline layers can increase the dielectric constant of the whole nanolaminate structure. According to another embodiment of the present invention, the nanolaminate contains only amorphous metal oxide layers for obtaining extremely low leakage current while having sufficiently high dielectric constant.

"High-k" material, for the purposes of describing layers in the nanolaminate structure of the present embodiment, is defined as a metal oxide that has higher dielectric constant than $Al_2O_3$ (about 10). High-k metal oxides that can be utilized in the metal oxide nanolaminate include oxides of elements in Group 4, (Ti, Zr and Hf) and Group 5 (V, Nb and Ta) of the periodic table of elements. "High-k" materials can also include lanthanide oxides, such as lanthanum oxide (k≈21, neodymium oxide (k≈16) and cerium dioxide (k≈15).

Advantageously, employing amorphous layers, such as $Al_2O_3$ and lanthanide oxides, in the nanolaminate structure makes it possible to utilize other high-k metal oxides that may have rather high leakage current themselves. Such "leaky" materials can include binary compounds, (e.g., $SnO_2$, $WO_3$), ternary compounds (e.g., metal titanates such as Ba, Sr, Ca, Mg or Pb titanates; metal zirconates such as $PbZrO_3$; and metal niobates such as $Pb_5Nb_4O_{15}$) and quaternary compounds (e.g., Ba—Zn—Ta—oxide and Zr—Sn—Ti oxide). As these complex oxides can have much high dielectric constant values, reaching into the 100's, it would be advantageous if they could be incorporated into dielectric stacks without degrading yield or performance.

According to one embodiment of the present invention, the crystal growth of a high-k metal oxide can be interrupted with an intermediate amorphous metal oxide layer, particularly $Al_2O_3$ or a lanthanide oxide, in a stack of dielectric layers (a dielectric "nanolaminate"). These intermediate amorphous layers affect the crystallization temperature of the dielectric material. Decreasing the individual metal oxide layer thickness in the nanolaminate structure, while keeping the total thickness of the nanolaminate unchanged, increases the crystallization temperature of the high-k metal oxide. Increased crystallization temperature can effectively decrease the leakage current through the dielectric material, since an amorphous thin film will demonstrate a lower leakage current than a corresponding crystalline thin film.

From this standpoint, the most basic nanolaminate construction comprises at least two high-k layers separated by a thin aluminum oxide or lanthanide oxide film, thereby interrupting the crystal structure of the high-k layers. Preferably, the separating oxide film has a thickness of no more than about 4 molecular monolayers, more preferably no more than about 2 molecular monolayers, thereby minimizing the thickness of the dielectric nanolaminate while still accomplishing the interruption of high-k crystal structure. In terms of absolute thickness, preferably the separating oxide film has a thickness between about 3 Å and 15 Å, more preferably less than about 10 Å. This interrupting or separating layer is also referred to herein as an interface layer, particularly an "intermediate" interface layer. More preferably, the stack further includes additional aluminum oxide or lanthanide oxide films on the outer surfaces of the high-k dielectric layers.

Figure 4:
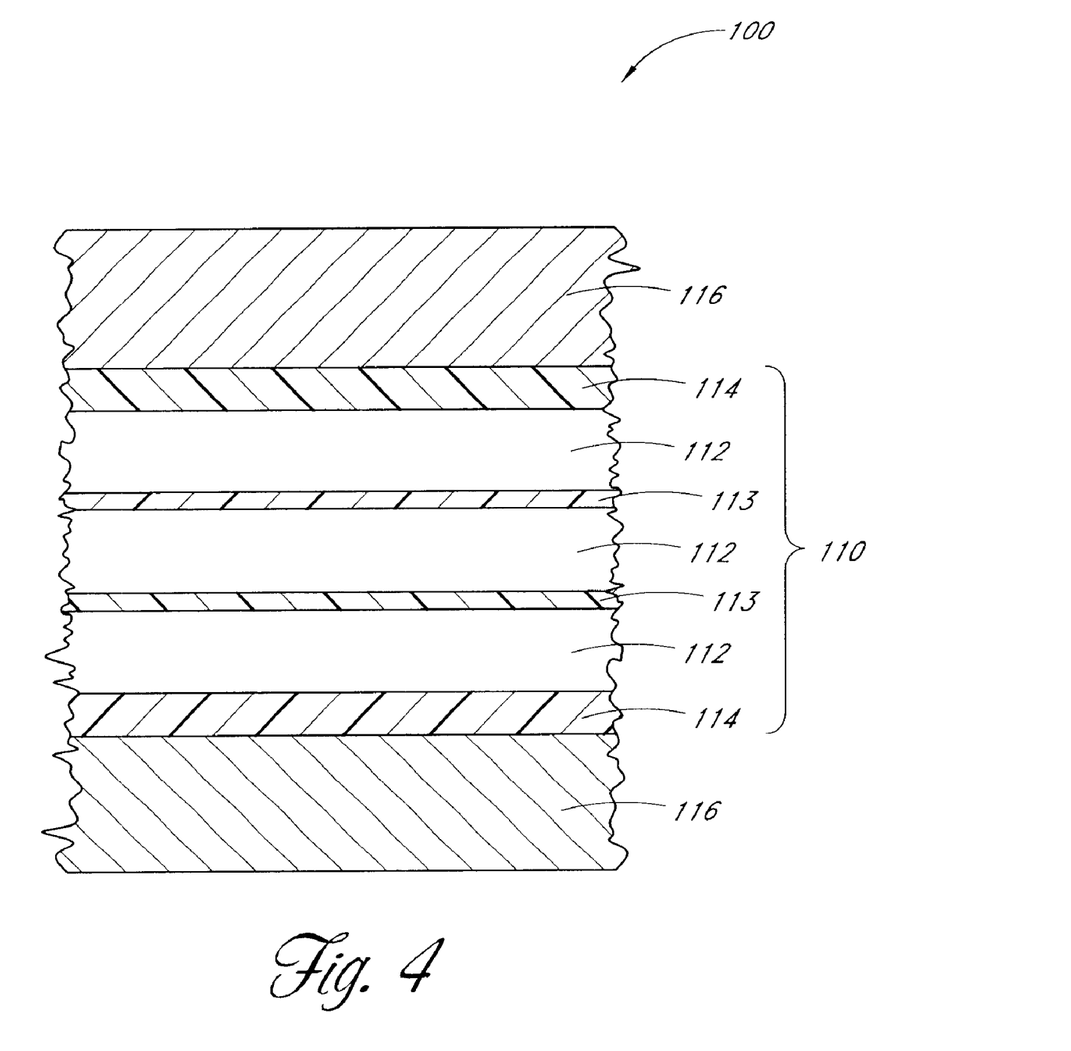
FIG. 4 is a schematic view of an integrated circuit capacitor comprising a nanolaminate structure, in accordance with the preferred embodiments.

With reference to FIG. 4 (see also Example 6 below) a memory cell structure 100 is shown, including 4 thin interface films alternated with 3 high-k films. In particular, a dielectric nanolaminate 110 comprises three 30 Å high-k films 112 of $ZrO_2$, separated by 5 Å intermediate interface films 113 of $Al_2O_3$. Additionally, the outer surfaces of the outermost high-k films 112 are covered with 10 Å outer interface films 114 of $Al_2O_3$. Note that the outermost aluminum oxide films are twice the thickness of the intermediate aluminum oxide films. These outer interface layers 114 thus better serve as a barrier to oxygen and dopant diffusion to and from conductors 116 on either side of the dielectric nanolaminate 110. It will be understood that the aluminum oxide films 113, 114 can be replaced with lanthanide oxide film. Alternatively, due to the high dielectric strength of lanthanide oxides, the zirconium oxide films 112 can be replace by lanthanide oxides.

ALD $Al_2O_3$ and ALD lanthanide oxides can perfectly cover the substrate surface, even when the oxide layer thickness approaches the lattice constant of the metal oxide. Most of the dielectric thickness can be reserved for the high-k component. Thus, the capacitance density of the layered dielectric structure made by ALD is better than that obtained with other deposition methods. Integrated circuit (IC) capacitor applications, such as DRAM memory cell capacitors, will benefit from the present invention.

Another benefit of the present invention is that the gate oxide thickness can be minimized without sacrificing the reliability of the manufactured devices. Either encapsulating a high-k material with an extremely thin and uniform aluminum oxide or lanthanide oxide layer, preferably by ALD, leads to excellent equivalent oxide thickness (EOT). As will be appreciated by the skilled artisan in the field of integrated circuit design, dielectric structures layers with low EOT yet low leakage current is beneficial in that it facilitates scaling transistor and integrated circuit designs generally. Similarly, forming a metal oxide nanolaminate by ALD produces excellent EOT with low leakage current.

Atomic layer deposition (ALD) processes require volatile source chemicals that are thermally stable and reactive at the deposition temperature. Sufficient volatility for purposes of ALD is defined as a minimum vapor pressure of the compound that is sufficient to cover the whole substrate with a single molecular layer of source chemical molecules during the source pulse time at the deposition temperature. When using very short pulse times in the order of 0.1–0.5 s, the minimum vapor pressure of the source compound should be approximately 0.02 mbar at the deposition temperature. The deposition temperature, in turn, is selected to be above condensation temperature while below thermal decomposition temperatures for the selected precursors, enabling adsorption without decomposition and permitting the self-limiting process.

As noted above, lanthanides can be made volatile with selected ligands that prevent interaction between lanthanide atoms in the precursor or source. Examples of suitable ligands include beta-diketonates, such as thd (thd=2,2,6,6-tetramethyl-3,5-heptanedione) and alkyldisilazanes, such as hmds (hmds=N(Si(CH$_3$)$_3$)$_2$). Aluminum has a wide range of volatile compounds, such as halides AlCl$_3$, AlBr$_3$, AlI$_3$, alkoxides, such as Al(OCH$_2$CH$_3$)$_3$, alkyls, such as (CH$_3$)$_3$Al, beta-diketonates, such as Al(thd)$_3$ and anhydrous nitrate Al(NO$_3$)$_3$.

A skilled artisan will understand that, although the deposition examples deal with ALD operated at about 5–10 mbar absolute reaction chamber pressure, the metal oxide nanolaminates can also be grown by ALD at a different pressure range. Other possible deposition methods at very low pressures, e.g., molecular beam epitaxy (MBE), can be used for growing the metal oxide nanolaminate.

EXAMPLES

Example 1

ALD of Aluminum Oxide from (CH$_3$)$_3$Al and Water

With reference again to FIG. 2, in a preferred embodiment, the aluminum source pulse 50 comprises trimethyl aluminum or TMA) ((CH$_3$)$_3$Al) fed into the reaction space. TMA chemisorbs on hydroxyl (—OH) groups on the substrate surface. Methane is released as a byproduct. The self-saturating surface reaction leaves a methyl-terminated aluminum oxide layer on the surface. The removal 55 comprises flowing inert gas flow to purge residual TMA and methane from the reaction space. The oxygen source pulse 60 comprises a water pulse that reacts with the methyl groups on aluminum oxide. The self-saturating surface reaction leaves a hydroxyl-terminated aluminum oxide layer on the substrate surface and methane gas is released as a byproduct. The second removal 65 also comprises flowing inert gas to purge residual water and methane from the reaction space. The substrate surface is now ready to receive the next TMA pulse. Alternating TMA and H$_2$O reactant pulses increases the thickness of the aluminum oxide film uniformly over the substrate until a desired thickness is obtained.

A silicon wafer was loaded into the reaction space of Pulsar™ 2000 reactor (commercially available from ASM Microchemistry of Espoo, Finland), which is designed for ALD processes. The reaction space was evacuated to vacuum with a mechanical vacuum pump. After evacuation the pressure of the reaction space was adjusted to about 5–10 mbar (absolute) with flowing nitrogen gas that had a purity of 99.9999%. Then the reaction space was stabilized at 300° C. Alternating vapor phase pulses of (CH$_3$)$_3$Al and H$_2$O, vaporized from external sources, were introduced into the reaction space and contacted with the substrate surface. The source chemical pulses were separated from each other with flowing nitrogen gas.

The pulsing cycle consisted of four basic steps:

(CH$_3$)$_3$Al pulse

N$_2$ purge

H$_2$O pulse

N$_2$ purge

Each of the pulsing and purging times was on the order of 0.5 s. The pulsing cycle was repeated 100 times.

After the growth process, the silicon substrate was unloaded from the reaction space. The growth rate of Al$_2$O$_3$ from (CH$_3$)$_3$Al and H$_2$O was typically near 0.1 nm/cycle at 300° C. The number of cycles determine the thickness of the layer, with an average of about 1 Å/cycle, or about 3–4 cycles/monolayer (Al$_2$O$_3$ has a bulk lattice parameter of about 3 Å). The methyl terminations left by each TMA pulse reduce the number of available chemisorption sites, such that less than a full monolayer forms with each pulse. Thus, in order to achieve the thickness ranges set forth above, preferably between 1 and 18 cycles, more preferably between about 3 and 12 cycles, and most preferably between about 3 and 8 cycles are performed.

The Al$_2$O$_3$ layer may serve as an oxygen diffusion barrier and thus prevent the oxidation of the silicon substrate. In one embodiment, the Al$_2$O$_3$ layer serves as a seed layer for further thin film growth. For example, a high-k layer may be grown on the Al$_2$O$_3$ layer. In another embodiment silicon or silicon germanium is deposited on the Al$_2$O$_3$ layer, and the Al$_2$O$_3$ layer serves as an interfacial layer.

Example 2

ALD Processes Using Aluminum Beta-diketonates

Aluminum acetylacetonate, i.e. Al(acac)$_3$, and tris-(2,2,6,6-tetramethyl-3,5-heptanedionato)aluminum, i.e. Al(thd)$_3$, react slowly with water. In the process aluminum oxide is formed and Hacac or Hthd vapor is released. Faster surface reactions are possible when using ozone as an oxygen source. However, ozone is preferably used only for the growth of the top interfacial aluminum oxide layer, as noted above in the discussion of preferred oxygen source materials, to avoid oxidation of the underlying substrate.

Example 3

Replacing a SiO$_2$ Interface Layer with Al$_2$O$_3$ by an Exchange Reaction

An ALD reactor or a CVD reactor is used for the process. A substrate with a silicon dioxide surface is placed into the reaction space. The pressure can be atmospheric, but preferably the pressure of the reaction space is adjusted to about 1–10 mbar. The substrate temperature is adjusted to between about 300° C. and 400° C. Vaporized aluminum compound, preferably aluminum halide and more preferably aluminum chloride, is contacted with the substrate surface for about two minutes.

When $AlCl_3$ vapor is contacted with a $SiO_2$ surface, solid $Al_2O_3$ is formed on the surface and $SiCl_4$ vapor is formed. The Gibb's free energy of this reaction is favorable for the formation of aluminum oxide.

$$1.5SiO_2(s)+2AlCl_3(g) \rightarrow Al_2O_3(s)+1.5SiCl_4(g) \; \Delta G_f(300°\text{ C.})=-52 \text{ kJ} \quad [2]$$

The completion of the exchange reaction can be monitored, e.g. with a quadrupole mass spectrometer located at the exhaust side of the reaction space. The reaction has ended when there is no volatile silicon compound (e.g., silicon chloride) left in the gas phase of the reaction space. The flow of the volatile aluminum compound into the reaction space is stopped. The reaction space is preferably evacuated to remove residual gaseous aluminum compound before unloading the substrate or continuing with another thin film process.

The replacement reaction depends upon diffusion of the aluminum source chemical through the growing aluminum oxide layer, which forms first at the surface. Accordingly, the process is self-limiting and desirably is conducted to form only a thin interfacial aluminum oxide layer, with thicknesses in the ranges discussed above. For purposes of improved nucleation thereover, the thickness can be less than a full monolayer.

In one embodiment, a $SiO_2$ gate dielectric layer can be formed over a substrate and only a thin top portion of the $SiO_2$ is converted, serving as a nucleation layer for later polysilicon or poly-SiGe gate electrode deposition, and preferably also as a diffusion barrier. The aluminum oxide interface layer has an increased k value as compared to the prior $SiO_2$ surface.

In another arrangement, a thin $SiO_2$ layer is completely converted into a thin interfacial aluminum oxide in contact with the underlying substrate. The gate dielectric can be completed by deposition of a high-k material over the aluminum oxide interface layer, and optionally a further top interface layer of aluminum oxide.

Example 4

The Deposition of a Thin Aluminum Oxide Interface Layer

A silicon wafer was loaded into the reaction space of Pulsar™ 2000 reactor (ASM Microchemistry), which is designed for ALD processes. The reaction space was evacuated to vacuum with a mechanical vacuum pump. After evacuation the pressure of the reaction space was adjusted to about 5–10 mbar (absolute) with flowing nitrogen gas that had a purity of 99.9999%. Then the reaction space was stabilized at about 300° C. Alternating vapor phase pulses of $(CH_3)_3Al$ and $H_2O$, vaporized from external sources, were introduced into the reaction space and contacted with the substrate surface. The source chemical pulses were separated from each other at the gas phase of the reaction space with flowing nitrogen gas.

The pulsing cycle consisted of the four basic steps:
$(CH_3)_3Al$ pulse
$N_2$ purge
$H_2O$ pulse
$N_2$ purge Each of the pulsing and purging times was in the order of 0.5 s. The pulsing cycle was repeated 3, 6, 9 or 12 times, representing about 1, 2, 3 and 4 monolayers, respectively. After the deposition of the $Al_2O_3$ layer, a high-k layer was formed on the $Al_2O_3$ surface. The high-k layer, such as $HfO_2$ or $ZrO_2$, can be processed with ALD (see Example 5) or any other suitable deposition process, such as CVD, PVD and spin-on deposition processes.

The lower thickness limit for the $Al_2O_3$ layer that separates the silicon substrate from the high-k material is about one molecular layer to serve as a minimal thickness barrier layer against oxygen and other diffusion (e.g., boron diffusion). However, there were indications that even one aluminum source chemical pulse followed by one oxygen source chemical pulse was sufficient to create a suitable surface for rapid nucleation and deposition of a high-k material or in situ doped silicon layer thereover. This single-cycle process represents less than a full monolayer, due to the physical size of the chemisorbed species (including organic tails) from the first pulse. The upper thickness limit for the $Al_2O_3$ layer depends on the acceptable equivalent oxide thickness (EOT).

Example 5

An Aluminum Oxide Sandwich in a Gate Dielectric

A silicon wafer was dipped in HF solution to remove silicon dioxide. Residual HF was washed away with purified water. Then the wafer was placed in the reaction chamber of an F450™ reactor, which is commercially available from ASM Microchemistry Ltd. of Espoo, Finland.

Reactor conditions were set for sequential deposition of both aluminum oxide and zirconium oxide films by ALD. The reactor was evacuated with a mechanical pump. The pressure of the reaction chamber was adjusted in the 5–10 mbar range with flowing nitrogen gas. The temperature of the reaction chamber, and thus of the substrate, was set to about 300° C. $ZrCl_4$ source chemical outside the reaction chamber was heated to 175° C.–180° C. Trimethyl aluminum TMA was vaporized at room temperature from an external source container. $H_2O$ was used as an oxygen source. It was vaporized at room temperature from an external source container. Any inactive gas, such as nitrogen or argon, can be used for purging the reactor. Nitrogen was used for the experiments.

The deposition started with the growth of an $Al_2O_3$ layer. An aluminum oxide thin film can be prepared on a silicon substrate as described above. A slightly modified process was employed in the experiments. TMA vapor was introduced to the reaction chamber and contacted with the wafer surface for 0.2 s. This is referred to as pulse 1. The reaction chamber was purged with nitrogen gas for 1.1 s to remove surplus TMA and byproducts from the reaction chamber. This is referred to as purge 1. Then water vapor was introduced to the reaction chamber and exposed to the wafer surface for 1.5 s. This is referred to as pulse 2. Residual $H_2O$ and reaction byproducts were removed by purging the reaction chamber for 3.0 s. This is referred to as purge 2. During each of the reaction phases, the reactants are supplied in sufficient quantity for the given other parameters to saturate the surface.

This exemplary aluminum oxide deposition cycle is summarized in Table I.

TABLE I

| | | $Al_2O_3$ | | |
|---|---|---|---|---|
| Phase | Reactant | Temperature (° C.) | Pressure (mbar) | Time (sec) |
| pulse 1 | TMA | 300 | 5–10 | 0.2 |
| purge 1 | — | 300 | 5–10 | 1.1 |
| pulse 2 | $H_2O$ | 300 | 5–10 | 1.5 |
| purge 2 | — | 300 | 5–10 | 3.0 |

This deposition cycle, consisting of pulse 1, purge 1, pulse 2 and purge 2, was repeated 10 times. The deposition rate of $Al_2O_3$ from TMA and $H_2O$ is about 1 Å/cycle on average at 300° C., such that the $Al_2O_3$ layer thickness after 10 cycles is about 10 Å.

A high-k dielectric layer is then formed on the aluminum oxide thin film. The high-k dielectric layer may be made of any material known in the art. Preferably the dielectric constant is greater than 5, more preferably greater than 10.

The high-k dielectric layer can also be formed by an ALD type process. The skilled artisan will appreciate, however, that the high-k dielectric material can be formed by any suitable method (e.g., MOCVD), and the advantages of the described aluminum oxide interface layers will still obtain. In the illustrated embodiment, $ZrO_2$ is deposited by an ALD type process. $ZrCl_4$ vapor was introduced to the reaction chamber and exposed the wafer surface for 1.5 s. This is referred to as pulse A. The reaction chamber was purged with nitrogen gas for 3.0 s to remove surplus $ZrCl_4$ and byproducts from the reaction chamber. This is referred to as purge A. Then water vapor was introduced to the reaction chamber and exposed to the wafer surface for 3.0 s. This is referred to as pulse B. Residual $H_2O$ and reaction byproducts were removed by purging the reaction chamber for 4.0 s. This is referred to as purge B. During each of the reaction phases, the reactants are supplied in sufficient quantity for the given other parameters to saturate the surface.

This exemplary high-k deposition cycle is summarized in Table I.

TABLE II

| | | $ZrO_2$ | | |
|---|---|---|---|---|
| Phase | Reactant | Temperature (° C.) | Pressure (mbar) | Time (sec) |
| pulse A | $ZrCl_4$ | 300 | 5–10 | 1.5 |
| purge A | — | 300 | 5–10 | 3.0 |
| pulse B | $H_2O$ | 300 | 5–10 | 3.0 |
| purge B | — | 300 | 5–10 | 4.0 |

The cycle of Table I, consisting of pulse A, purge A, pulse B, purge B, was repeated 51 times. The average deposition rate is about 0.59 Å/cycle at 300° C., such that the $ZrO_2$ thickness was about 30Å.

In the above example, temperatures during the $ZrO_2$ deposition were kept at the same temperature as the previous $Al_2O_3$ deposition to facilitate rapid in situ processing. More generally, temperatures during the process preferably fall between about 200° C. and 500° C. For an amorphous $ZrO_2$ layer, the temperature is more preferably at the low end of this range, between about 200° C. and 250° C., and most preferably at about 225° C. For a crystalline film, the temperature is more preferably at the high end of this range, between about 250° C. and 500° C., and most preferably about 300° C. As will be appreciated by the skilled artisan, however, mixtures of amorphous and crystalline composition result at the boundary of these two regimes. The illustrated process produces a largely crystalline $ZrO_2$ film.

In this case, the metal monolayer formed in the metal phase is self-terminated with chloride, which does not readily react with excess $ZrCl_4$ under the preferred conditions. The preferred oxygen source gas, however, reacts with the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, sufficient cycles are conducted to grow between about 20 Å and 60 Å of $ZrO_2$. More preferably, sufficient cycles are conducted to grow between about 20 Å and 40 Å. The dielectric constant of the layer is between about 18 and 24. In the illustrated examples, 30 Å of $ZrO_2$ was formed.

To form an aluminum oxide sandwich, a second layer of aluminum oxide is deposited on top of the high-k layer, in this case $ZrO_2$, also by the ALD $Al_2O_3$ process described above and summarized in Table I. Desirably, the structure was coated with another 10 Å of aluminum oxide. Thus, the dielectric sandwich comprised 10 Å $Al_2O_3$/30 Å $ZrO_2$/10 Å $Al_2O_3$. The second layer of aluminum oxide serves as a nucleation layer for subsequent deposition of a polysilicon or poly-SiGe gate electrode layer, and more preferably also serves as a minimum thickness to serve as a diffusion barrier between the high-k material and a second material.

The remaining components of a gate stack are formed on the upper layer of aluminum oxide by methods well known in the art. Advantageously, known CVD processes for depositing doped silicon and poly-SiGe layers nucleate rapidly on $Al_2O_3$, improving overall throughput. The aluminum oxide layers present between the substrate and the high-k material and between the high-k material and the gate electrode act as diffusion barriers and allow the gate dielectric to function properly. In addition, the aluminum oxide layers help to stabilize the high-k material, allowing for a repeatable, production worthy process of manufacturing gate electrodes in integrated circuits.

Another experiment was made where the thicknesses of the deposited thin films were as follows: 5 Å $Al_2O_3$/30 Å $ZrO_2$/5 Å $Al_2O_3$.

Example 6

$ZrO_2/Al_2O_3$ Nanolaminate

Still another experiment was made where the thin film consisted of a metal oxide nanolaminate. Several layers of $ZrO_2$ and amorphous $Al_2O_3$ were grown. The processes of Tables I and II above were employed, forming a structure similar to that of FIG. 4. The structure was as follows:

10 Å $Al_2O_3$/5 Å $ZrO_2$/5 Å $Al_2O_3$/5 Å $ZrO_2$/5 Å $Al_2O_3$/5 Å $ZrO_2$/ 10 Å $Al_2O_3$.

Current leakage through the structures was very small and remarkably small EOTs (equivalent oxide thicknesses) were obtained.

GENERAL DISCUSSION

The selection of source chemical combinations depends on the location of the interface. When depositing an interface layer on silicon by ALD, highly oxidative source chemicals should be avoided. It is preferable to use a relatively mild oxygen source such as water. Water reacts quickly with alkyl aluminum compounds but does not oxidize silicon, especially when the substrate temperature is below 300° C.

When depositing an $Al_2O_3$ interface layer on high-k material by ALD, mild oxygen sources as well as highly oxidative source chemicals (e.g., ozone) can be used.

Those skilled in the art will understand that the deposition of the $Al_2O_3$ interface layer is not limited to the ALD method. Example 3, for example, provides a different but also self-limiting process for thin aluminum oxide layer formation. Furthermore, other CVD, MOCVD or PVD methods can be applied as long as a sufficiently uniform film covering the substrate is obtained.

It will be appreciated by those skilled in the art that various omissions, additions and modifications may be made to the processes described above without departing from the scope of the invention, and all such modifications and changes are intended to fall within the scope of the invention, as defined by the appended claims.

We claim:

1. A process for forming a dielectric stack in an integrated circuit, process comprising:
    depositing aluminum oxide or lanthanide oxide over a semiconductor substrate; and
    depositing a dielectric material with a dielectric constant of at least 5 directly over the aluminum oxide or lanthanum oxide,
    wherein the aluminum oxide or lanthanide oxide is deposited by at least one of the following cycle:
        forming no more than about one monolayer of an aluminum or lanthanide complex over a semiconductor substrate by exposure to a first reactant species;
        reacting an oxygen source gas with the first material to leave no more than about one monolayer of aluminum oxide or lanthanide oxide over the semiconductor substrate.

2. The process of claim 1, further comprising repeating the cycle between about 3 and 15 times to form an aluminum oxide or lanthanide oxide interface layer.

3. The process of claim 1, further comprising repeating the cycle at least once after depositing the dielectric material to form a top aluminum oxide or lanthanide oxide interface layer.

4. The process of claim 3, further comprising depositing a silicon-containing layer over the top interface layer.

5. A process for forming a dielectric stack in an integrated circuit, the process comprising:
    depositing aluminum oxide or lanthanide oxide over a semiconductor substrate by an atomic layer deposition process;
    depositing a dielectric material with a dielectric constant of at least 5 directly over the aluminum oxide or lanthanum oxide; and
    depositing aluminum oxide or lanthanide oxide over the dielectric material.

* * * * *

UNITED STATES PATENT AND TRADEMARK OFFICE
CERTIFICATE OF CORRECTION

PATENT NO.        : 6,660,660 B2                                            Page 1 of 1
APPLICATION NO.   : 09/945463
DATED             : December 9, 2003
INVENTOR(S)       : Haukka et al.

It is certified that error appears in the above-identified patent and that said Letters Patent is hereby corrected as shown below:

On page 2, column 1, line 12 under OTHER PUBLICATIONS, please delete "$Ta_2O_5$" and replace with -- $Ta_2O_5$-$Nb_2O_5$ --.

On page 2, column 2, line 2 under OTHER PUBLICATIONS, please delete "trimethyaiuminum" and replace with -- trimethylaluminum --.

At column 2, line 19, please delete "$Ta_xO_yNb_z$" and replace with -- $Ta_xO_yN_z$ --.

At column 5, line 25, please delete "6= ′" and insert -- 6 ′ --.

At column 6, line 41, after "precursors" please insert -- . --.

At column 8, line 25, please replace [????] and insert -- kj    [1] --.

At column 9, line 41, please delete "Fihns" and insert -- Films --.

In Claim 1, at column 17, line 25, after "circuit" please insert -- the --.

Signed and Sealed this

Twenty-sixth Day of February, 2008

JON W. DUDAS
*Director of the United States Patent and Trademark Office*